United States Patent [19]

Tateyama

[11] Patent Number: 5,967,159
[45] Date of Patent: Oct. 19, 1999

[54] SUBSTRATE CONVEYING DEVICE AND SUBSTRATE CONVEYING METHOD

[75] Inventor: Kiyohisa Tateyama, Kumamoto, Japan

[73] Assignee: Tokyo Electron Limited, Tokyo, Japan

[21] Appl. No.: 09/075,926

[22] Filed: May 12, 1998

[30] Foreign Application Priority Data

May 15, 1997 [JP] Japan .................................. 9-139142

[51] Int. Cl.$^6$ .............................. B08B 3/00; B65G 49/07
[52] U.S. Cl. .............................. 134/61; 134/66; 134/902; 414/937; 414/941
[58] Field of Search .................................. 134/124, 126, 134/902, 61, 66; 414/744.2, 744.6, 744.8, 752, 935, 941, 937

[56] References Cited

U.S. PATENT DOCUMENTS

| | | | |
|---|---|---|---|
| 3,853,313 | 12/1974 | Appenzeller et al. ..................... | 269/21 |
| 4,846,626 | 7/1989 | Engelbrecht .............................. | 414/754 |
| 5,135,349 | 8/1992 | Lorenz et al. .......................... | 414/744.6 |
| 5,177,514 | 1/1993 | Ushijima et al. ......................... | 354/319 |
| 5,195,862 | 3/1993 | Cruz ......................................... | 414/416 |
| 5,310,442 | 5/1994 | Ametani .................................. | 156/353 |
| 5,479,108 | 12/1995 | Cheng ..................................... | 324/765 |
| 5,518,542 | 5/1996 | Matsukawa et al. ...................... | 118/52 |
| 5,553,396 | 9/1996 | Kato et al. ................................. | 34/406 |
| 5,622,400 | 4/1997 | George ..................................... | 294/64.1 |
| 5,695,817 | 12/1997 | Tateyama et al. . | |
| 5,842,824 | 12/1998 | Nishi ........................................ | 414/225 |
| 5,851,296 | 12/1998 | Haraguchi et al. ...................... | 118/719 |

FOREIGN PATENT DOCUMENTS 5-152266  6/1993  Japan .

Primary Examiner—Frankie L. Stinson
Assistant Examiner—Paul J. Lee
Attorney, Agent, or Firm—Oblon, Spivak, McClelland, Maier & Neustadt, P.C.

[57] ABSTRACT

According to the present invention, there is provided a substrate conveying apparatus for loading/unloading a substrate to/from a processing section, including an arm for holding the substrate on an upper surface thereof, an arm drive mechanism for driving the arm such as to load/unload the substrate to/from the processing section, first and second suction members each having an opening communicating to a suction hole of the suction passage, for supporting the substrate by at least an edge portion of the opening, and a switching mechanism for selectively switching a mode between the support of the substrate by the first suction member and that by the second suction member.

8 Claims, 6 Drawing Sheets

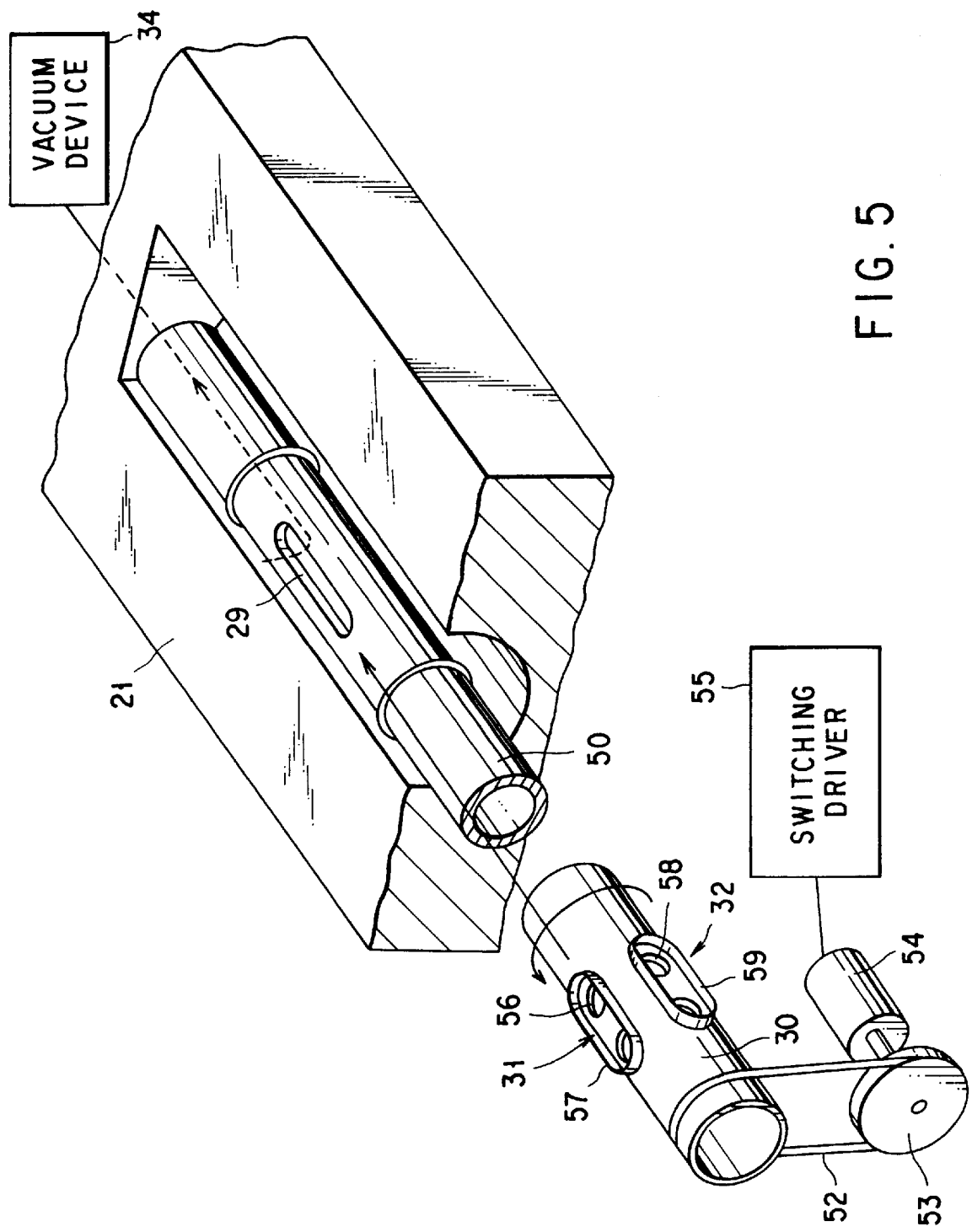
F I G. 5

SUBSTRATE CONVEYING DEVICE AND SUBSTRATE CONVEYING METHOD

BACKGROUND OF THE INVENTION

The present invention relates to a substrate conveying device for conveying a substrate such as a semiconductor wafer or an LCD glass substrate, between a cassette and a processing unit.

Generally, in the manufacture of a semiconductor device, photolithography is employed so as to form a circuit, an electrode pattern or the like, on a substrate such as a semiconductor substrate. In the photolithography, a series of processing steps, namely, the washing and drying of the substrate, the formation of a resist film on the substrate, the exposure of the resist film, the development, and the like, are carried out. In the processing device for carrying out these processing steps, substrates unloaded from a cassette placed in the cassette station are conveyed to the processing unit one by one while being held on an arm, and the substrates are subjected to the processing steps including washing, one after another. After that, the substrates which have been processed at each processing unit, are conveyed back into the cassette one by one while being held on the arm.

With regard to the arm for conveying substrates, where the section of the upper surface for supporting a unwashed substrate and the section for supporting a washed substrate are used in common, the following problem easily occurs. That is, when an unwashed substrate is placed on the arm, a contaminant attached to the rear surface of the unwashed substrate is transferred onto the supporting section of the arm, and the transferred contaminant may then easily be further transferred via the arm onto the rear surface of a washed substrate, while conveying the washed substrate on the arm.

In order to solve the described problem, for example, Jpn. Pat. Appln. KOKAI Publication No. 5-152266 proposes a substrate conveying device. More specifically, in the substrate conveying device disclosed in Jpn. Pat. Appln. KOKAI Publication No. 5-152266, a substrate unloading arm for taking out an unwashed substrate from a cassette, and conveying it to the washing unit, and a substrate loading arm for returning a substrate finished with washing in the washing unit, to the cassette are formed to be separate mechanisms, so as to avoid the reattachment of a contaminant.

However, in the above-described substrate conveying device having separate mechanisms for an arm for unloading a substrate, and another arm for loading a processed substrate, it is naturally required to have separate arms for loading and unloading. Further, the driving mechanism for switching the arms for loading and unloading is relatively large in size, and therefore the entire structure of the apparatus becomes complicated. Furthermore, in the above-described apparatus, the entire arm is, for example, rotated, and therefore a wide space is required for fully moving the arm therein. Thus, the space of the device cannot be effectively used.

BRIEF SUMMARY OF THE INVENTION

The object of the present invention is to provide a substrate conveying device capable of avoiding, for example, the reattachment of a contaminant onto a substrate, with a simple structure, as well as a method therefor.

In order to achieve the above-described object, there is provided, according to the present invention, a substrate conveying device for loading/unloading a substrate to/from a processing section, comprising:

an arm for holding the substrate on an upper surface thereof;

an arm drive mechanism for driving the arm such as to load/unload the substrate to/from the processing section;

a suction passage provided in the arm and having a suction hole opened in the upper surface of the arm;

first and second suction members each having an opening communicating to a suction hole of the suction passage, for selectively supporting the substrate.

a switching mechanism for selecting between the support of the substrate by the first suction member and that by the second suction member by switching over.

According to the substrate conveying device of the present invention, when conveying an unwashed substrate to the processing section, for example, the first suction member is selectively moved to a position above the suction hole and thus the rear surface of the substrate is supported by the first suction member and suctioned by the suction hole. Meanwhile, when conveying a substrate already washed in the processing section, for example, the second suction member is selectively moved to a position above the suction hole and thus the rear surface of the substrate is supported by the second suction member and is suctioned by the suction hole via the second suction member.

That is, for conveying processed and not-yet-processed substrates on the same surface of the arm, the first and second suctioning sections are moved selectively to a position above the suction hole to support the substrates. Consequently, the reattachment of contaminant can be easily prevented.

Further, it is possible that the first and second suction members are provided with a cover member which covers the suction hole, and the first and second members are separated each other by predetermined distance.

With the above-described structure, the supporting the substrate by the first suction member and that by the second suction member can be switched over by driving the cover member.

Furthermore, it is possible that the first suction member is fixed to the arm, and the second suction member supports the substrate selectively with the suction member by covering the first suction member.

With the above-described structure, the supporting by the first suction member and that by the second suction member can be selectively switched over by covering the second suction member by the first suction member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a perspective view of an embodiment having the structure in which the entire suction pipe having a cylindrical shape, embedded in the surface portion of the arm, is covered with a cover member having a cylindrical shape, illustrating a decomposed state in which the cover member is removed from the suction pipe;

DETAILED DESCRIPTION OF THE INVENTION

Figure 1:
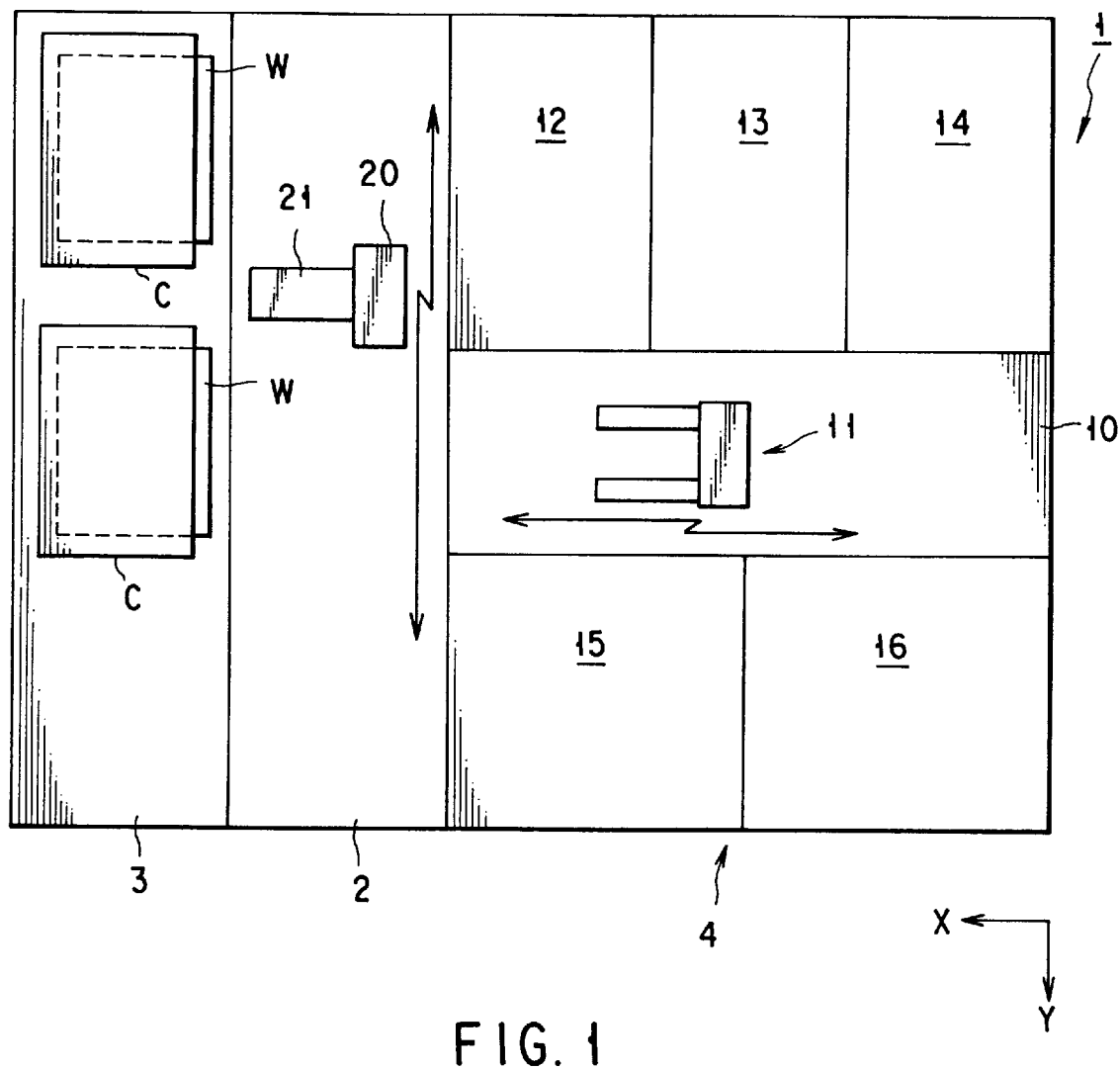
FIG. 1 is a plan view of a washing apparatus.

A preferred embodiment of the present invention will now be described in connection with a washing apparatus 1 for washing a substrate W. FIG. 1 is a plan view of the washing apparatus 1 for washing a substrate W such as a semiconductor wafer or an LCD substrate. The washing apparatus 1 includes a substrate conveying device 2 according to the embodiment of the present invention, and a cassette station 3 and a washing unit 4 located on the respective sides of the substrate conveying device 2 to face each other.

In the cassette station 3, cassettes C loaded by, for example, a conveying robot (not shown) are placed. In each of the cassettes C, a plurality of substrates W are stored as they are arranged in a horizontal position to be parallel with each other with a predetermined interval therebetween. A substrate W is, for example, a semiconductor wafer having a round disk shape, or an LCD glass substrate having a rectangular shape.

A conveying passage 10 is formed at the center of the washing device 4, and a main conveying arm 11 is moved along the conveying passage 10. In the embodiment shown in FIG. 1, scrubber units 15 and 16 for washing substrates W using pure water or various types chemicals such as an ammonium aqueous solution, a hydrogen peroxide aqueous solution and a hydrogen fluoride aqueous solution, are provided on one side of the conveying passage 10. Further, dryer units 12, 13 and 14 used for drying substrates W are arranged on the other side of the conveying passage 10. As the main conveying arm 11 conveys the substrates W to the units 12 to 16 in a predetermined order, as it moves along the conveying passage 10, the substrates are subjected to the washing process.

The substrate conveying device 2 has an arm 21 mounted onto the front surface of the base 20. In the substrate conveying device 2, the base 20 can be moved in the XY direction, ascended/descended in the vertical direction, and rotated around the vertical axis. As the base 20 moves as just-described, an unwashed substrate W is unloaded from a cassette C placed in the cassette station 3, and conveyed while the substrate W being held on the arm 21 to be passed onto the main conveying arm 11 of the washing unit 4. Then, a substrate W already washed in the washing unit 4 is received from the main conveying arm 11 and conveyed while being held on the arm 21, to be returned to the cassette C in the cassette station 3.

The base 20 is supported by a forward/backward mechanism 22 for moving the base 20 set in the posture shown in FIG. 2, forward or backward horizontally in the X axial direction, with respect to the cassette C, a rotation ascending/descending mechanism 23 for rotating or ascending/descending the arm 21 by supporting the lower surface of the forward/backward mechanism 22 rotatably and ascendably/descendably, and a lateral movement mechanism 25 for moving the arm 21 in the lateral direction as it supports the rotation ascending/descending mechanism 23 from the bottom and travels along a rail 24 provided in the Y axial direction.

As the forward/backward mechanism 22, the rotation ascending/descending mechanism 23 and the lateral movement mechanism 25 move in cooperation with each other, the arm 21 is moved upwards while the arm 21 is being fit in the cassette C placed in the cassette station 3. Thus, an unwashed substrate W can be unloaded from the cassette C. Then, thus unloaded substrate W is conveyed while being held on the arm 21, and passed on to the main conveying arm 11 of the washing unit 4, which stands by in the rear side of the substrate conveying device 2. In the case where a substrate W already washed in the washing unit 4 is returned to the cassette C, the substrate W is placed on the arm 21 by the main conveying arm 11, and then conveyed while being held on the arm 21, to be returned to the cassette C of the cassette station 3.

On the upper surface of the arm 21, a suction hole 29 is provided at, for example, three locations or more. Further, cover members 30 are provided on the arm 21 so as to cover the upper sections of the suction holes 29, respectively, and each cover member 30 has a first suctioning section 31 and a second suctioning section 32. Although a detailed structure will be described later on, as each cover member 30 is moved, and either one of the first suctioning section 31 and the second suctioning section 32 is placed selectively at a position above the hole 29. Thus the states where the lower surface of a substrate W is supported by the first suctioning section 31 placing at a position covering the hole 29, and where the lower surface of a substrate W is supported by the second suctioning section 32 placing at a position covering the hole 29, can be switched over.

Figure 3:
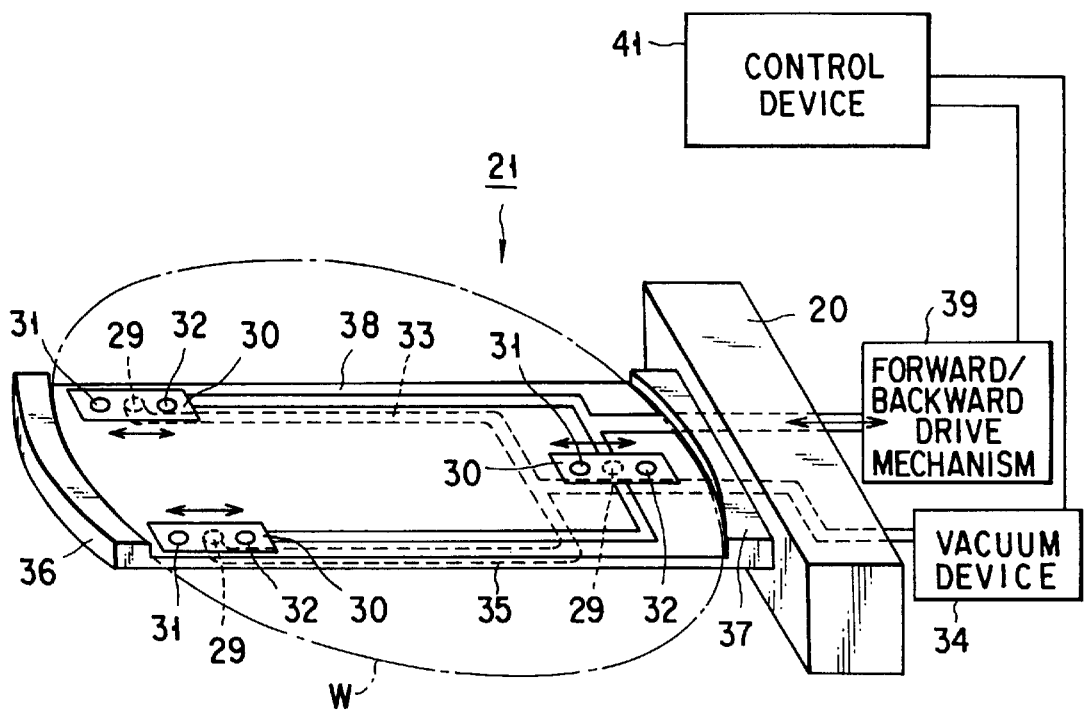
FIG. 3 is a perspective view of an arm appropriate for conveying a substrate such as a semiconductor wafer.

FIG. 3 is a perspective view of the arm 21 suitable for conveying a substrate W such as a semiconductor wafer having a round disk shape, in particular. As can be seen in FIG. 3, the arm 21 consists of the base 20 and a plate member 35 mounted onto the front surface of the base 20. On the upper surface of the plate member 35, the suction hole 29 is provided at three locations, and the cover member 30 having the first and second suction portions 31 and 32, is provided for each one of the suction holes 29.

Each suction hole 29 is coupled to a suction passage 33 made in the arm 21, and the suction passage 33 is connected to a vacuum device 34. The cover members 30 are coupled with each other by means of a coupling member 38, and they can be moved as an integral unit by driving the coupling member 38. The coupling member 38 is connected to the forward/backward drive mechanism 39. Appropriate examples which can be employed as the forward/backward drive mechanism 39 are an air cylinder, a linear motor and a rack and pinion mechanism and the like.

Further, in the case of the present embodiment shown in FIG. 3, guides 36 and 37 are provided, respectively, at the distal and proximal end portions of the plate member 35, so as to position the periphery of a substrate W such as a semiconductor wafer. With the guides 36 and 37, the states where the lower surface of a substrate W positioned between the guides 36 and 37 is suctioned by the suction hole 29 via the first suctioning section 31 onto the upper surface of the plate member 35, and where the lower surface of a substrate W is suctioned by the suction hole 29 via the second suctioning section 32, can be switched over as the cover member 30 is appropriately moved.

This switching operation is carried out by driving the vacuum device 34 and the forward/backward drive mechanism 39, as such an instruction is given from the control device 41. It should be noted that the guides 36 and 37 are not essential to the present invention.

Figure 4:
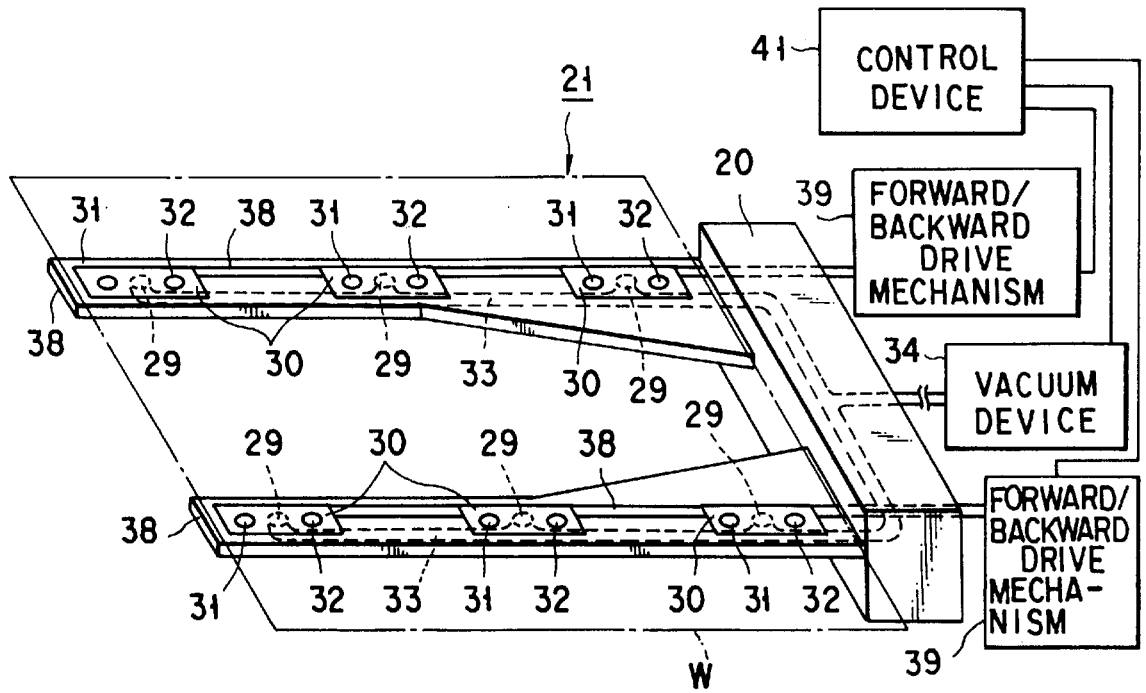
FIG. 4 is a perspective view of an arm appropriate for conveying a substrate such as an LCD glass substrate.

FIG. 4 is a perspective view of the arm 21 suitable for conveying a substrate W such as an LCD glass substrate having a rectangular shape, in particular. As can be seen in the figure, the arm 21 consists of the base 20 and two arm members 38 mounted onto the front surface of the base 20. On the upper surface of the arm members 38, the suction holes 29 are provided at three locations in each arm member; therefore six locations in total. Further, the cover member 30 having the first and second suction portions 31 and 32, is provided for each one of the suction hole 29. With the described structure, the states where the lower surface of a substrate W is suctioned by the suction hole 29 via the first suctioning section 31 onto the upper surfaces of the two arm members 38, and where the lower surface of a substrate W is suctioned by the suction hole 29 via the second suctioning section 32, can be switched over.

Each suction hole 29 is connected to a vacuum device 34 via a suction passage 33 as in the case shown in FIG. 3, and the cover members 30 are connected to the forward/backward drive mechanism 39 via a coupling member 38. The first suctioning section 31 and the second suctioning section 32 can be switched over, by controlling the vacuum device 34 and the forward/backward drive mechanism 39 using the control device 41.

As described above, the shape of the arm 21 may be freely selected, for example, one plate member 35 or two arm members 38. Further, it suffices if the suction hole is provided at least three locations on the upper surface of the arm 21, so as to stably support the lower surface of the substrate W.

In the washing device 1 shown in FIG. 1, first, a cassette C conveyed by the conveying robot or the like is placed in the cassette station 3. In the cassette C, unwashed substrates W are stored to be parallel in a multi-step arrangement.

Next, the operation for unloading substrates W from the inside of the cassette C is started by using the arm 21 of the substrate conveying device 2. More specifically, the forward/backward mechanism 22, the rotation ascending/descending mechanism 23 and the lateral movement mechanism 25, illustrated in FIG. 2, are operated in cooperation with each other, so as to move the arm 21. Thus, the arm 21 is inserted to the cassette C placed in the cassette station 3, and the arm 21 is moved upwards. Note that in order to unload a substrate W from the cassette C, the first suctioning section 31 is situated above the suction hole 29 by moving the cover member 30 in advance. In this manner, a substrate W stored in the cassette C is held up from below on the arm 21, and the lower surface of the substrate W contained in the cassette C is suctioned by the suction hole 29 via the first suctioning section 31. Then, the substrate W thus held on the arm 21 is unloaded from the cassette C.

Next, while maintaining the state where the lower surface of the substrate W thus unloaded is suctioned by the suction hole 29 via the first suctioning section 31 on the arm 21, the substrate W is conveyed by operating the forward/backward mechanism 22, the rotation ascending/descending mechanism 23 and the lateral movement mechanism 25 in cooperation with each other, and passed onto the main conveying arm 11 of the washing device 4, standing by in the rear of the substrate conveying device 2. As the main conveying arm 11 moves on, thus passed substrate W is carried to each of the units 12 to 16 in a predetermined order, where the respective processes are performed on the substrate W. When the washing process in the washing device 4 is finished, the substrate W is set in a stand-by status in the rear of the substrate conveying device 2 in the posture held on the main conveying arm 11 of the washing device 4.

Figure 2:
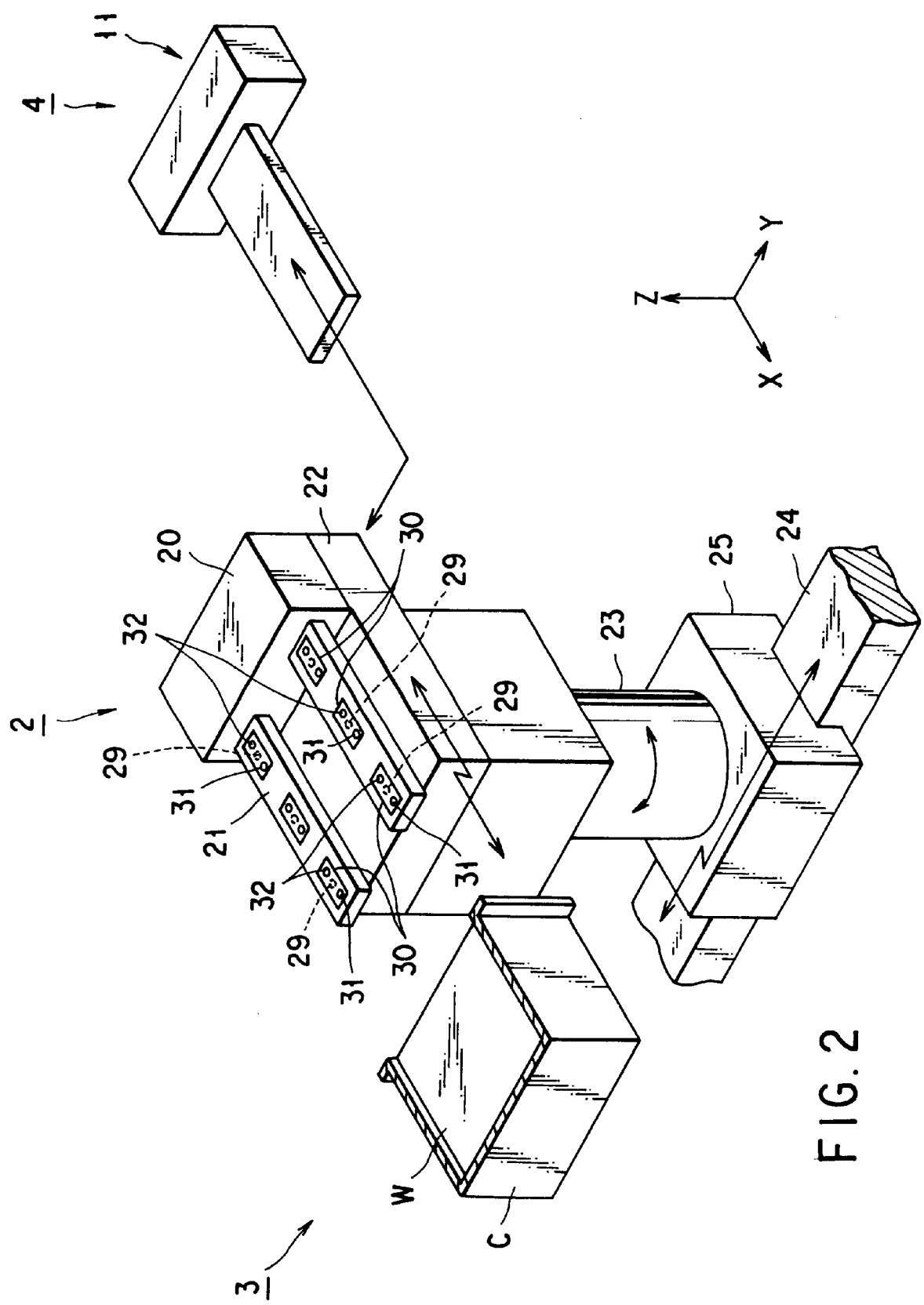
FIG. 2 is a perspective view of a substrate conveying device according to an embodiment of the present invention.

Next, in order to return a substrate W washed in the washing process in the washing device 4 to the cassette C, the arm 21 is moved to be situated underneath the substrate W standing by in the posture placed on the main conveying arm 11 in the rear of the substrate conveying device 2, by operating the forward/backward mechanism 22, the rotation ascending/descending mechanism 23 and the lateral movement mechanism 25, illustrated in FIG. 2, in cooperation with each other. Then, the arm 21 is moved upwards. During the washed substrate W being returned to the cassette C, the second suctioning section 32 is situated above the suction hole 29 by moving the cover member 30 in advance. Thus, the substrate W placed on the main conveying arm 11 is held up on the arm 21 from below, and the lower surface of the substrate W is suctioned by the suction holes 29 via the second suctioning sections 32. Further, the substrate W passed on to the arm 21 is conveyed by operating the forward/backward mechanism 22, the rotation ascending/descending mechanism 23 and the lateral movement mechanism 25 in cooperation with each other, and then returned to the cassette C in the cassette station 3. As the above-described operation is repeated and the all the substrates W stored in the cassette C are finished with the washing process, the cassette C is unloaded from the cassette station 3 by the conveying robot or the like.

To summarize, in the substrate conveying device 2 according to the present embodiment, substrates W are conveyed between a cassette C placed in the cassette station 3 and the main conveying arm 11 of the washing device 4 in the following manner. That is, an unwashed substrate W is supported by the first suctioning section 31 and suctioned by the suction hole 29 via the first suctioning section 31. Meanwhile, a washed substrate W is supported by the second suctioning section 32 and suctioned by the suction hole 29 via the second suctioning section 32. Therefore, even if some contaminant is transferred from the lower surface of the unwashed substrate W to the first suctioning section 31, the contaminant is not re-attached to the washed substrate W. It should be noted that the re-attachment of contaminant can be prevented if the substrate conveying device 2 of this embodiment has a structure in which an unwashed substrate W is suctioned by the suction hole 29 via the second suctioning section 32 and conveyed from a cassette C to the main conveying arm 11, and a washed substrate W is suctioned by the first suctioning section 32 and conveyed from the main conveying arm 11 to a cassette C.

A preferable structure of the cover member 30 employed in the substrate conveying device 2 of the present invention will now be described.

FIG. 5 is a plan view of an embodiment in which the suction hole 29 is made in the upper surface of the cylindrical suction pipe 50 (corresponding to the suction passage 33) embedded in the arm 21 having a plate shape, such that a portion of the suction pipe exposed from the surface of the arm 21, and the entire pipe 50 including the suction hole 29 is covered by a rotatable cylindrical cover member 30. In this figure, in order to make the explanation simple, only one suction hole 29 was focused on. However, the suction hole 29 is provided at least three positions on the upper surface of the arm 21, and cover members 30 are prepared for the section holes 29, respectively.

In this embodiment, the first suctioning section 31 and the second suctioning section 32 are made in the circumferential surface of each cover member 34. As the cover member 30 is appropriately rolled while the cover member 30 is being mounted around the suction pipe 50, the states where the first suctioning section 31 is situated above the suction hole 29 and where the second suctioning section 32 is situated above the section hole 29 can be switched over.

The first suctioning section 31 and the second suctioning section 32 are formed at positions, for example, 90° displaced from each other in the peripheral direction, and they include openings 56 and 58, and supporting walls 57 and 59, respectively. The lower surface of a substrate W can be supported by the top end portions of the supporting walls 57 and 59.

It should be noted that the arm 21 is equipped with a driving mechanism for rotating each cover member 30, which consists of, for example, a belt 52 stretched around the outer circumference of each cover member 30, a pulley 53, a motor 54 for rotating the pulley 53, and a switching driver 55 for switching a supporting mode over between the first suctioning section 31 and the second suctioning section 32 by controlling the motor 54.

Figure 6:
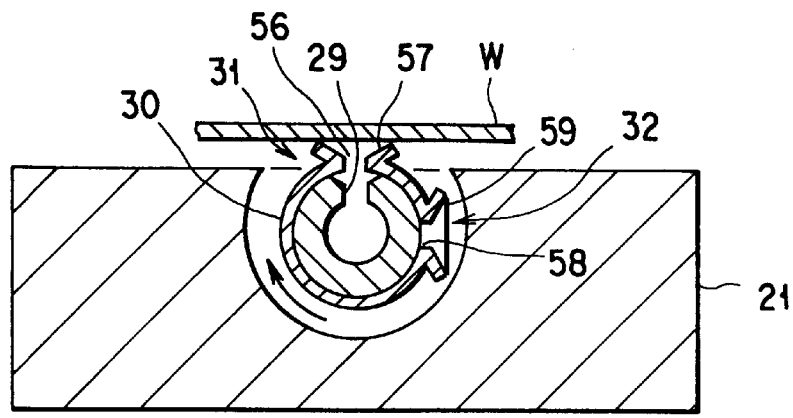
FIG. 6 is an explanatory view illustrating a state in which an unwashed substrate is conveyed by the embodiment shown in FIG. 5.
Figure 7:
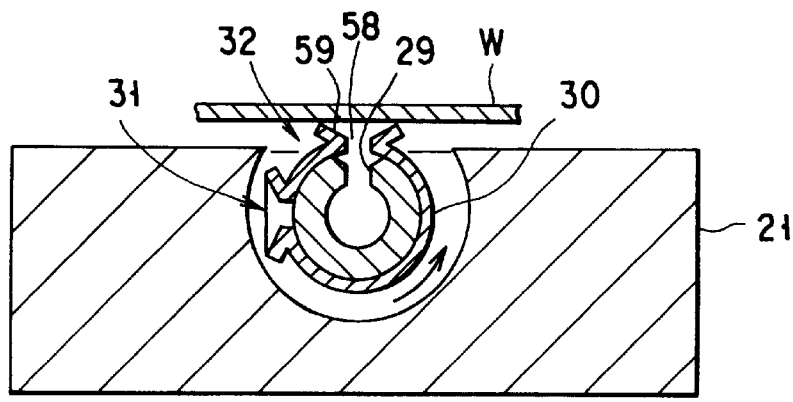
FIG. 7 is an explanatory view illustrating a state in which a washed substrate is conveyed by the embodiment shown in FIG. 5.

In the present embodiment, for conveying an unwashed substrate W while being held on the arm 21, the cover member 30 is rolled in the clockwise direction so as to move the first suctioning section 31 to the position above the suction hole 29. Then, the lower surface of the substrate W is suctioned by the suction hole 29 via the first suctioning section 31 as shown in FIG. 6. For conveying an washed substrate W while being held on the arm 21, the cover member 30 is rolled in the counter-clockwise direction so as to move the second suctioning section 32 to the position above the suction hole 29. Then, the lower surface of the substrate W is suctioned by the suction hole 29 via the second suctioning section 32 as shown in FIG. 7. Therefore, as in this embodiment, the states where the lower surface of the substrate W is sectioned via the first suctioning section 31 and where it is suction via the second suctioning section 32 are switched over between before and after washing. In this manner, the re-attachment of the contaminant transferred from an unwashed substrate W to the first suctioning section 31, onto an washed substrate W can be prevented.

It should be noted that an unwashed substrate W may be suctioned via the second suctioning section 32, whereas a washed substrate W may be suctioned via the first suctioning section 31, in reverse to the above-described embodiment.

Figure 8:
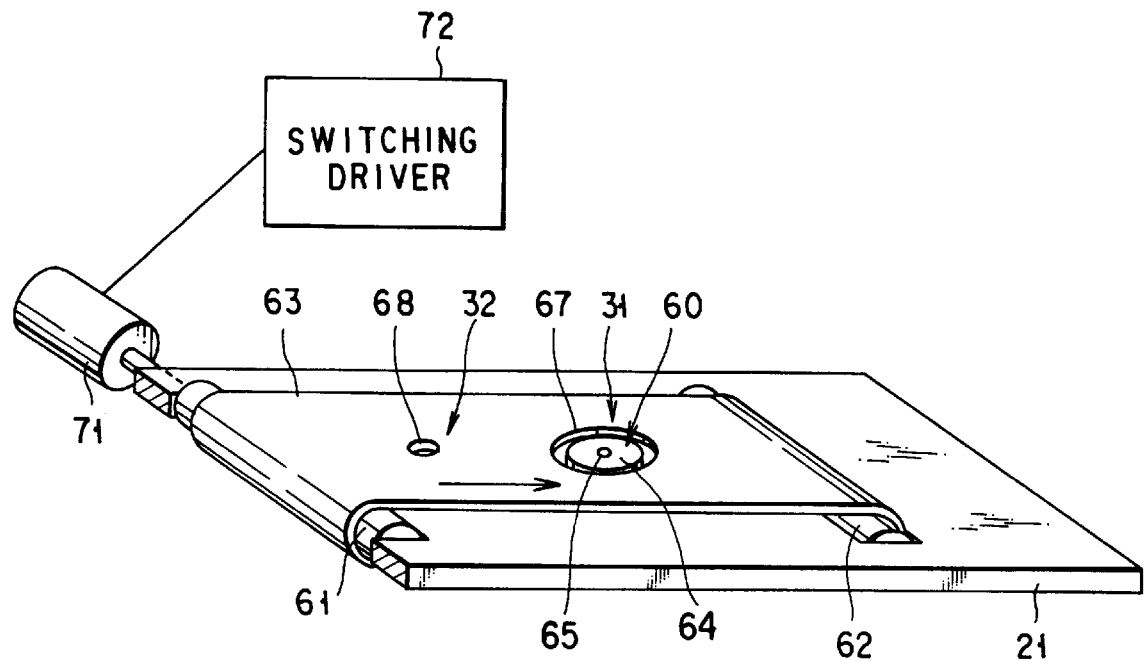
FIG. 8 is a perspective view of an embodiment having a structure in which the upper surface of a suction pad is covered with a cover member.

FIG. 8 shows another embodiment having a structure in which a suction pad 60 (the first suctioning section 31) is fixedly mounted in the suction hole 29 of the suction passage 33 provided in the arm 21. A opening 65 made at the center of the upper surface 64 of the suction pad 60, is to be covered by a rotatable endless belt-like cover member 30 stretched between a driving roller 61 and a driven roller 62.

In order to make the explanation simple, only one suction pad 60 was focused on in the above description. However, the suction pad 60 of the described structure is provided at least three locations on the upper surface of the arm 21, and cover members 30 are prepared for the section pads 60, respectively, as in the case illustrated with reference to FIG. 5.

Figure 9:
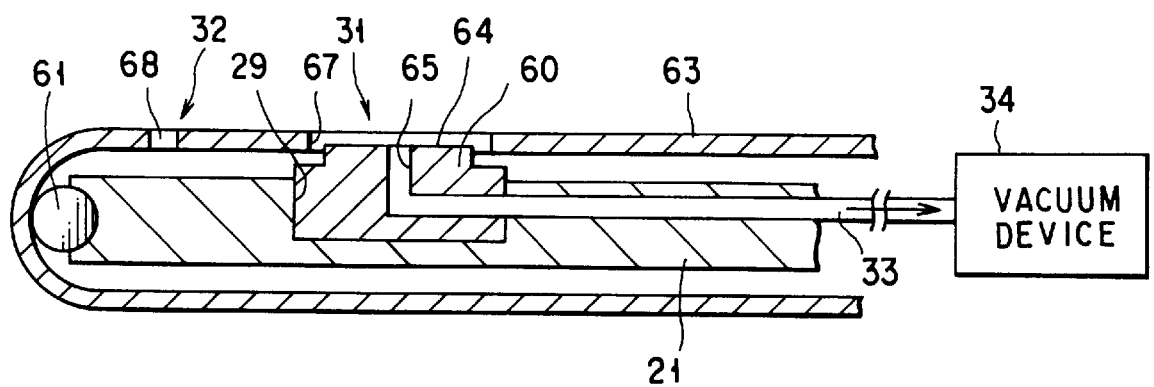
FIG. 9 is a cross sectional view of an arm of the embodiment shown in FIG. 8.

As shown in FIG. 9, a hole 65 of the suction pad 60 is connected to the suction passage 33, which is further connected to the vacuum device 34. With this structure, the rear surface of a substrate W can be suctioned on the upper surface 64 of the suction pad 60 by operating the vacuum device 34.

In each cover member 63, an opening 67 having a size sufficiently large to expose the upper surface 64 of the suction pad 60, and an opening 68 (opening for the second suctioning section 32) having a size substantially the same as that of the hole 65 situated at the center of the upper surface 64 of the suction pad 60 are made.

Then, the drive motor 71 shown in FIG. 8 is operated by a suctioning section switching driver 72, and as the drive roller 61 is driven to rotate, the cover member 30 is rolled, thus making it possible to switch a supporting mode between the first and second suctioning sections 31 and 32.

Figure 10:
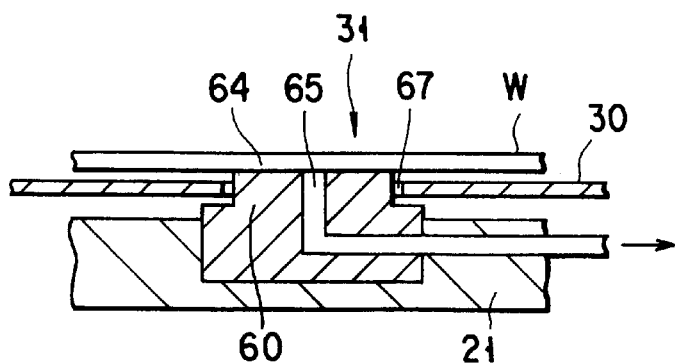
FIG. 10 is an explanatory diagram for illustrating the state in which a substrate before washing is conveyed, in connection with the embodiment shown in FIG. 8.
Figure 11:
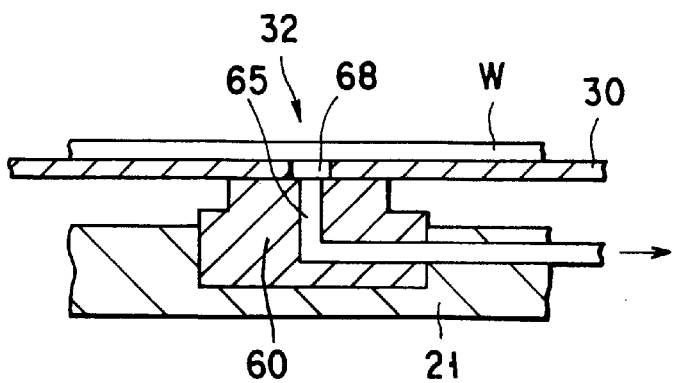
FIG. 11 is an explanatory diagram for illustrating the state in which a substrate after washing is conveyed, in connection with the embodiment shown in FIG. 8.

Further, in this embodiment, for conveying an unwashed substrate W while being held on the arm 21, the opening 67 is moved to the position above the suction pad 60 so as to expose the upper surface 64 of the suction pad 60 as shown in FIG. 10. Thus, the lower surface of the substrate W is suctioned while being brought into direct contact with the upper surface 64 of the suction pad 60. By contrast, for conveying a washed substrate W while being held on the arm 21, the second suctioning section 32 is moved to the position above the suction pad 60 so as to connect the opening 68 with the opening 65 as shown in FIG. 11. Thus, the lower surface of the substrate W is suctioned indirectly via the cover member 30.

As described above, according to the embodiment, the states where the lower surface of the substrate W is suctioned directly on the upper surface 64 of the suction pad 60 and where the lower surface of the substrate W is suctioned indirectly via the cover body 30 can be switched over between before and after washing while substrates W are conveyed being held on the arm. In this manner, the re-attachment of the contaminant transferred from an unwashed substrate W to the upper surface of the suction pad 60, onto an washed substrate W can be prevented. It should be noted that an unwashed substrate W may be suctioned indirectly via the cover member 30, whereas a washed substrate W may be directly suctioned onto the upper surface 64 of the suction pad 60, in reverse to the above-described embodiment.

It should be noted here that the present invention is not limited to the above-described embodiments, but can be remodeled into a variety of versions as long as the essence of the invention remains. For example, the present invention was described in connection with the washing device 1 for washing substrates W; however the present invention can be applied to various types of processing devices other than washing device, for example, the drying of a substrate, the formation of a resist film on a substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A substrate conveying device for loading/unloading a substrate to/from a processing section, comprising:

an arm for holding said substrate on an upper surface thereof;

an arm drive mechanism for driving said arm such as to load/unload said substrate to/from said processing section;

a suction passage provided in said arm and having a suction hole opened in the upper surface of said arm;

first and second suction members each having an opening communicating to a suction hole of the suction passage, for selectively supporting the substrate.

a switching mechanism for selecting between the support of the substrate by the first suction member and that by the second suction member by switching over.

2. A substrate conveying device according to claim 1, wherein said first and second suction members are provided on a cover member which movably covers said suction hole.

3. A substrate conveying device according to claim 2, wherein said suction passage has a suction pipe with said suction hole;

said cover member is a cylindrical member made on said first suction member and said second suction member formed away from each other in a circumferential direction; and said switching mechanism switches a supporting mode between said first suction member and said second suction member by rolling said cover member.

4. A substrate conveying device according to claim 2, wherein said first and second suction members each has a protruding portion formed on an outer surface of said cover member, said protruding portion having an end portion for supporting said substrate.

5. A substrate conveying device according to claim 2, wherein said processing section is a washing device for washing a substrate.

6. A substrate conveying device according to claim 1, wherein said first suction member is fixed to said arm, and said second suction member supports said substrate selectively with said suction member by covering said first suction member.

7. A substrate conveying device according to claim 6, wherein said second suction member is a sheet-like member having an opening communicating to said opening of said first suction member.

8. A substrate conveying device according to claim 7, wherein said second suction member is an endless belt-shaped sheet-like member, which has another opening for exposing said first suction member, at a position away from that of said opening communicating to said opening of said first suction member.

* * * * *